United States Patent
Susaki et al.

(10) Patent No.: US 9,633,898 B2
(45) Date of Patent: Apr. 25, 2017

(54) ETCHING LIQUID, ETCHING METHOD, AND METHOD OF MANUFACTURING SOLDER BUMP

(71) Applicant: EBARA CORPORATION, Tokyo (JP)

(72) Inventors: Akira Susaki, Tokyo (JP); Keiichi Kurashina, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/920,104

(22) Filed: Oct. 22, 2015

(65) Prior Publication Data

US 2016/0042993 A1 Feb. 11, 2016

Related U.S. Application Data

(62) Division of application No. 14/589,993, filed on Jan. 5, 2015, now abandoned.

(30) Foreign Application Priority Data

Jan. 8, 2014 (JP) ................. 2014-001837

(51) Int. Cl.
*H01L 21/768* (2006.01)
*C23F 1/18* (2006.01)
(Continued)

(52) U.S. Cl.
CPC .......... *H01L 21/76883* (2013.01); *C09G 1/02* (2013.01); *C09G 1/04* (2013.01); *C09K 13/00* (2013.01); *C09K 13/02* (2013.01); *C09K 13/06* (2013.01); *C23F 1/10* (2013.01); *C23F 1/14* (2013.01); *C23F 1/16* (2013.01);
(Continued)

(58) Field of Classification Search
CPC ......... H01L 21/30604; H01L 21/32134; H01L 21/76879; H01L 21/76802; H01L 21/76883; H01L 2224/0345; H01L 2224/03614; H01L 2224/03912; H01L 2224/0401; H01L 2224/11462; H01L 2224/1147; H01L 2224/1145; H01L 2224/13083; H01L 2224/13111; H01L 2224/13147; H01L 2224/13157; H01L 24/03; H01L 24/05; H01L 24/11; H01L 24/13; C23F 1/10; C23F 1/14; C23F 1/16; C23F 1/18; C23F 1/44; H05K 3/067; C09K 13/00; C09K 13/02; C09K 13/06; C09G 1/02; C09G 1/04
See application file for complete search history.

(56) References Cited

U.S. PATENT DOCUMENTS

2007/0290166 A1* 12/2007 Liu .................. C09K 3/1463
252/79.2
2010/0087065 A1 4/2010 Boggs et al.

FOREIGN PATENT DOCUMENTS

WO WO 2011/074589 A1 6/2011

* cited by examiner

*Primary Examiner* — Jiong-Ping Lu
(74) *Attorney, Agent, or Firm* — Baker & Hostetler LLP (57) ABSTRACT

An etching liquid which can selectively remove only a copper layer in an etching process of a multilayer structure including a cobalt layer and the copper layer is disclosed. The etching liquid is an etching liquid for etching the copper layer in the multilayer structure including the copper layer and the cobalt layer. This etching liquid includes at least one acid selected from a group consisting of citric acid, oxalic acid, malic acid, and malonic acid, and hydrogen peroxide, the etching liquid having pH in a range of 4.3 to 5.5.

5 Claims, 12 Drawing Sheets

(51) Int. Cl.
*C09K 13/00* (2006.01)
*C09G 1/02* (2006.01)
*C09G 1/04* (2006.01)
*C09K 13/06* (2006.01)
*H01L 21/306* (2006.01)
*H01L 21/3213* (2006.01)
*H05K 3/06* (2006.01)
*C23F 1/10* (2006.01)
*C23F 1/14* (2006.01)
*C23F 1/16* (2006.01)
*C23F 1/44* (2006.01)
*C09K 13/02* (2006.01)
*H01L 23/00* (2006.01)

(52) U.S. Cl.
CPC .................. *C23F 1/18* (2013.01); *C23F 1/44* (2013.01); *H01L 21/30604* (2013.01); *H01L 21/32134* (2013.01); *H01L 21/76802* (2013.01); *H01L 21/76879* (2013.01); *H05K 3/067* (2013.01); *H01L 24/03* (2013.01); *H01L 24/05* (2013.01); *H01L 24/11* (2013.01); *H01L 24/13* (2013.01); *H01L 2224/0345* (2013.01); *H01L 2224/03614* (2013.01); *H01L 2224/03912* (2013.01); *H01L 2224/0401* (2013.01); *H01L 2224/05647* (2013.01); *H01L 2224/1145* (2013.01); *H01L 2224/1147* (2013.01); *H01L 2224/11462* (2013.01); *H01L 2224/13083* (2013.01); *H01L 2224/13111* (2013.01); *H01L 2224/13147* (2013.01); *H01L 2224/13157* (2013.01)

ETCHING LIQUID, ETCHING METHOD, AND METHOD OF MANUFACTURING SOLDER BUMP

CROSS REFERENCE TO RELATED APPLICATION

This application is a divisional of U.S. patent application Ser. No. 14/589,993, filed Jan. 5, 2015, which claims priority to Japanese Patent Application Number 2014-001837 filed Jan. 8, 2014, the entire contents of which are hereby incorporated by reference.

BACKGROUND

Figure 14:
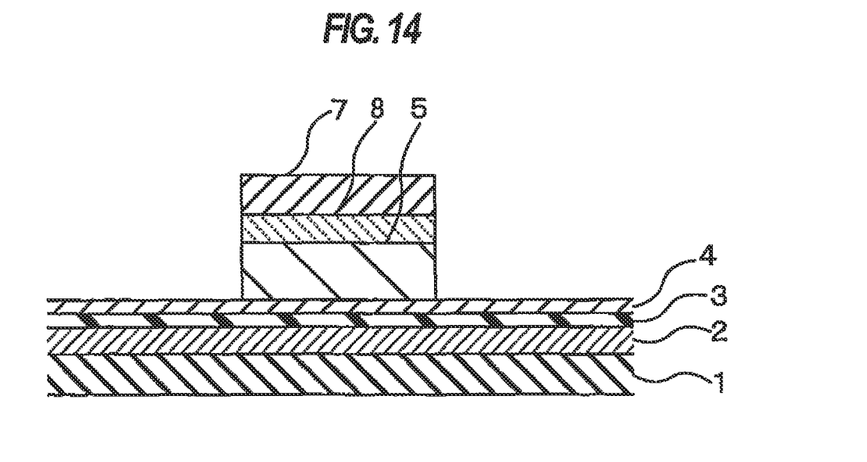
FIG. 14 is a cross-sectional view showing an example of a cross section of a multilayer structure for forming a solder bump.

As devices formed on a substrate, such as a semiconductor wafer, have been becoming finer in recent years, a solder bump, which is a protrusion-shaped metal electrode, is frequently used. FIG. 14 shows an example of a cross-section of a multilayer structure for forming the solder bump. As shown in FIG. 14, a dielectric layer 2 is formed on a silicon substrate 1, and a barrier metal layer 3 and a copper seed layer 4 are formed in this order on the dielectric layer 2. A copper bump layer 5 is then formed on the copper seed layer 4, and a barrier layer 8 is formed between the copper bump layer 5 and a solder layer 7. This barrier layer 8 is a layer for preventing an interdiffusion between the solder layer 7 and the copper bump layer 5. Nickel (Ni), palladium (Pd) or the like is typically used for the barrier layer 8. A lead-free solder, such as tin (Sn), tin-silver alloy (Sn—Ag alloy), or tin-copper alloy (Sn—Cu alloy), is used for the solder layer 7.

Figure 15:
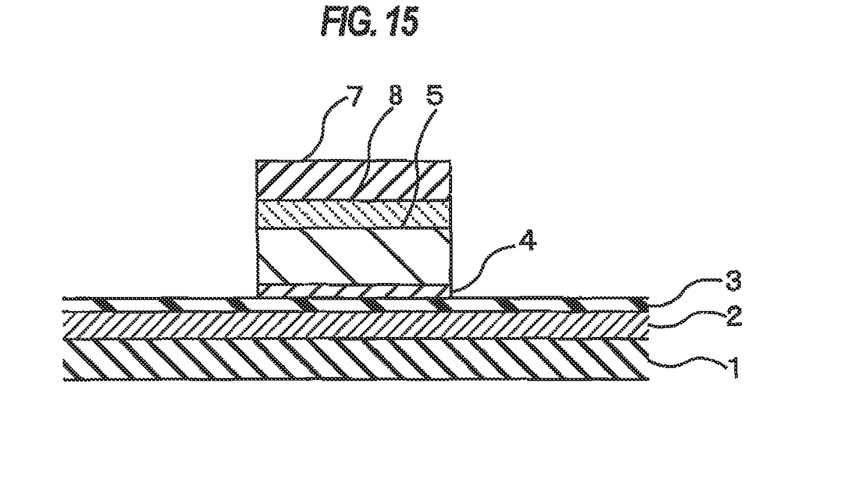
FIG. 15 is a cross-sectional view showing a state in which a copper seed layer is etched away by a conventional etching liquid.

In such a multilayer structure, it is necessary to etch and remove the copper seed layer 4 in locations where the copper bump layer 5 is not formed. Typically, wet etching using an etching liquid (i.e., a chemical liquid) or dry etching utilizing plasma is used for etching of a metal film. The wet etching is used for etching the copper seed layer 4, because a wet etching apparatus is relatively simple in its structure and low-cost. An SPM liquid (a mixture of sulfuric acid and hydrogen peroxide), ferric chloride, or the like is used as a conventional etching liquid in this wet etching. By using such an etching liquid, only the copper seed layer 4 can be etched away as shown in FIG. 15.

As described above, a metal used for the barrier layer 8 is typically nickel or palladium. It has recently been proposed to substitute cobalt (Co) for nickel or palladium from a viewpoint of safety and costs. However, if the conventional etching liquid described above is used in a case where cobalt is used as the barrier layer 8, cobalt dissolves more quickly than copper due to a local cell action caused by a contact between dissimilar metals. More specifically, the barrier layer 8 dissolves before the copper seed layer 4 dissolves, and as a result, the copper seed layer 4 hardly dissolves. Moreover, since the barrier layer 8 retreats, a sufficient bonding strength between the solder layer 7 and the barrier layer 8 cannot be obtained.

International patent publication No. WO 2011/074589 discloses an etching liquid which includes hydrogen peroxide and citric acid and can selectively etch copper without etching nickel. However, if the etching liquid disclosed in this International patent publication is applied to the above-described multilayer structure including the copper layer and the cobalt layer, the cobalt layer dissolves while the copper layer hardly dissolves.

SUMMARY OF THE INVENTION

According to an embodiment, there is provided an etching liquid and an etching method which can selectively remove only a copper layer in an etching process of a multilayer structure including a cobalt layer and a copper layer. Furthermore, according to an embodiment, there is provided a solder-bump manufacturing method including an etching process using such an etching liquid.

Embodiments, which will be explained below, relate to an etching liquid for etching a copper layer used for forming elements, such as a solder bump, an etching method using such an etching liquid, and a solder-bump manufacturing method using this etching method, and more particularly relate to an etching liquid and an etching method for etching a copper layer in a multilayer structure including the copper layer and a cobalt layer.

In an embodiment, there is provided an etching liquid for etching a copper layer in a multilayer structure including the copper layer and a cobalt layer, comprising: at least one acid selected from a group consisting of citric acid, oxalic acid, malic acid, and malonic acid; and hydrogen peroxide, the etching liquid having pH in a range of 4.3 to 5.5.

In an embodiment, the etching liquid further comprising: a pH adjuster including at least one of an aqueous sodium hydroxide, an aqueous solution of potassium hydroxide, an aqueous solution of ammonia, and an alkaline ionized water.

In an embodiment, the at least one acid is citric acid, and a concentration of citrate ions in the etching liquid is equal to or more than 0.2 mol/L.

In an embodiment, a concentration of the hydrogen peroxide is in a range of 0.7% to 10% by weight.

In an embodiment, there is an etching method, comprising: preparing an etching liquid including hydrogen peroxide and at least one acid selected from a group consisting of citric acid, oxalic acid, malic acid, and malonic acid, the etching liquid having pH in a range of 4.3 to 5.5; and bringing a multilayer structure including a copper layer and a cobalt layer into contact with the etching liquid to thereby etch the copper layer.

In an embodiment, the etching liquid further includes a pH adjuster including at least one of an aqueous sodium hydroxide, an aqueous solution of potassium hydroxide, an aqueous solution of ammonia, and an alkaline ionized water.

In an embodiment, the at least one acid is citric acid, and a concentration of citrate ions in the etching liquid is equal to or more than 0.2 mol/L.

In an embodiment, a concentration of the hydrogen peroxide is in a range of 0.7% to 10% by weight.

In an embodiment, there is provided a method of manufacturing a solder bump, comprising: applying a resist onto a copper seed layer; creating an opening in the resist; forming a copper bump layer, a cobalt layer, and a solder layer in this order in the opening by electroplating; removing the resist; and bringing an exposed portion of the copper seed layer into contact with an etching liquid to thereby etch the exposed portion of the copper seed layer, the etching liquid including, (i) at least one acid selected from a group consisting of citric acid, oxalic acid, malic acid, and malonic acid; and (ii) hydrogen peroxide, the etching liquid having pH in a range of 4.3 to 5.5.

According to the etching liquid of the above-described embodiments, only the copper layer can be etched away (or removed) without etching the cobalt layer.

DETAILED DESCRIPTION OF EMBODIMENTS

Embodiments will be explained with reference to the drawings.

Figure 1:
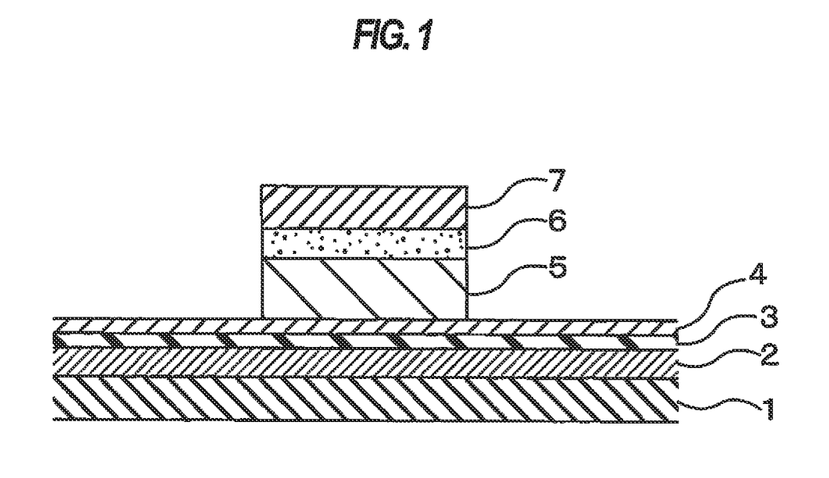
FIG. 1 is a cross-sectional view of an example of a multilayer structure to which an etching liquid according to an embodiment is to be applied.
Figure 2:
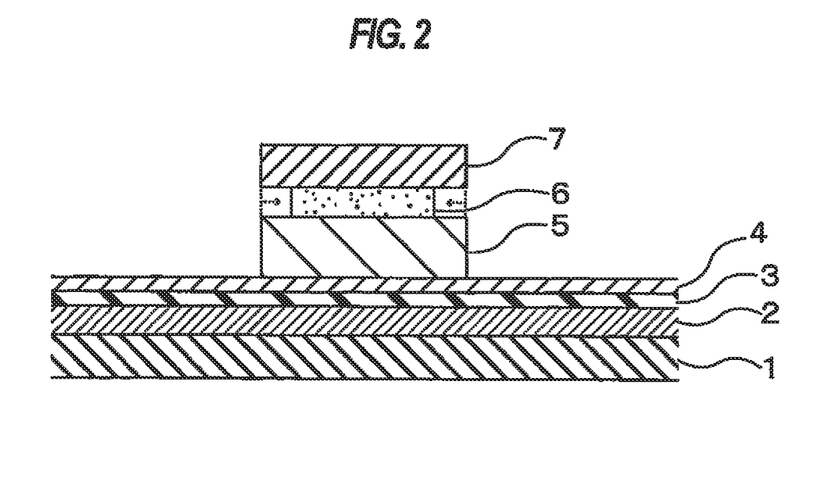
FIG. 2 is a cross-sectional view showing a state in which a cobalt layer is etched while a copper seed layer is not etched.

FIG. 1 is a view showing an example of a multilayer structure to which an etching liquid according to an embodiment is to be applied. As shown in FIG. 1, a dielectric layer 2 is formed on a silicon substrate 1, a barrier metal layer 3 is formed on the dielectric layer 2, and a copper seed layer 4 is formed on the barrier metal layer 3. The barrier metal layer 3 and the copper seed layer 4 are formed by respective sputtering methods. A copper bump layer 5, a cobalt layer 6 which is a barrier layer of cobalt, and a solder layer 7 are formed in this order at a predetermined position on the copper seed layer 4. If the substrate, having such a multilayer structure formed thereon, is brought into contact with a conventional etching liquid including sulfuric acid and hydrogen peroxide, the cobalt layer 6, which is most easily ionized, preferentially dissolves, while the copper seed layer 4 is not etched at all, as shown in FIG. 2. The possible reason for this is that, when the strongly acidic etching liquid composed of sulfuric acid and hydrogen peroxide is used, the cobalt dissolves more quickly than the copper due to a local cell action caused by a contact between dissimilar metals.

Thus, an etching liquid according to an embodiment includes hydrogen peroxide and at least one acid selected from a group consisting of citric acid, oxalic acid, malic acid, and malonic acid. This etching liquid has pH adjusted in a range of 4.3 to 5.5. Use of such etching liquid can selectively remove only the copper seed layer 4 without etching the cobalt layer 6 and the solder layer 7.

Figure 3:
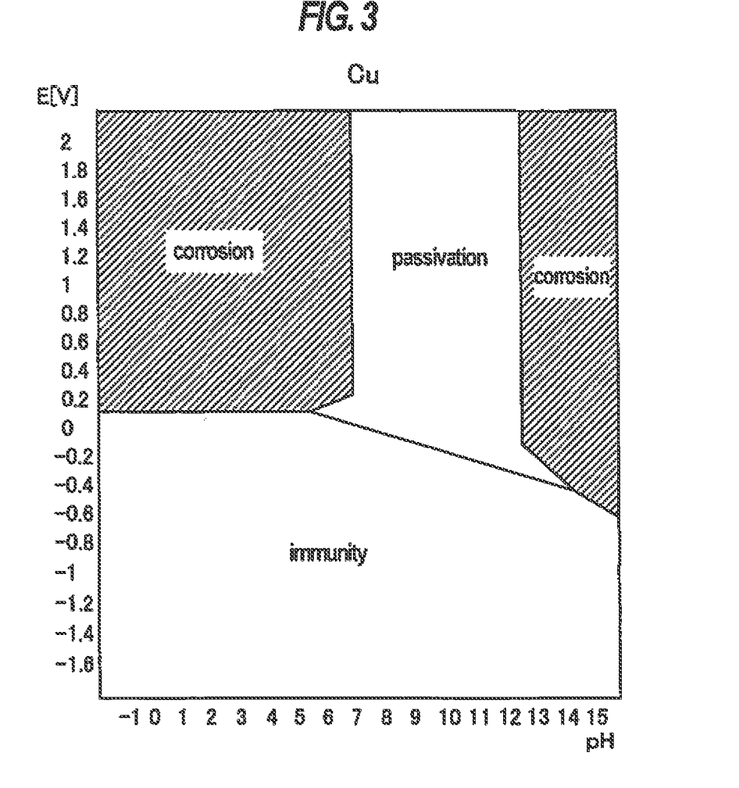
FIG. 3 is a Pourbaix diagram of copper.
Figure 4:
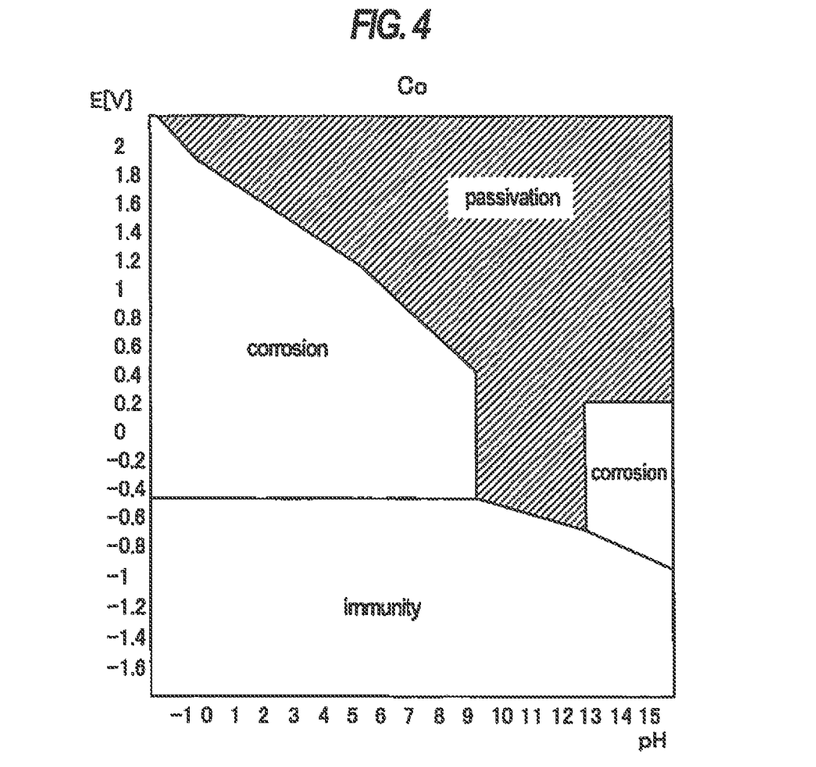
FIG. 4 is a Pourbaix diagram of cobalt.
Figure 5:
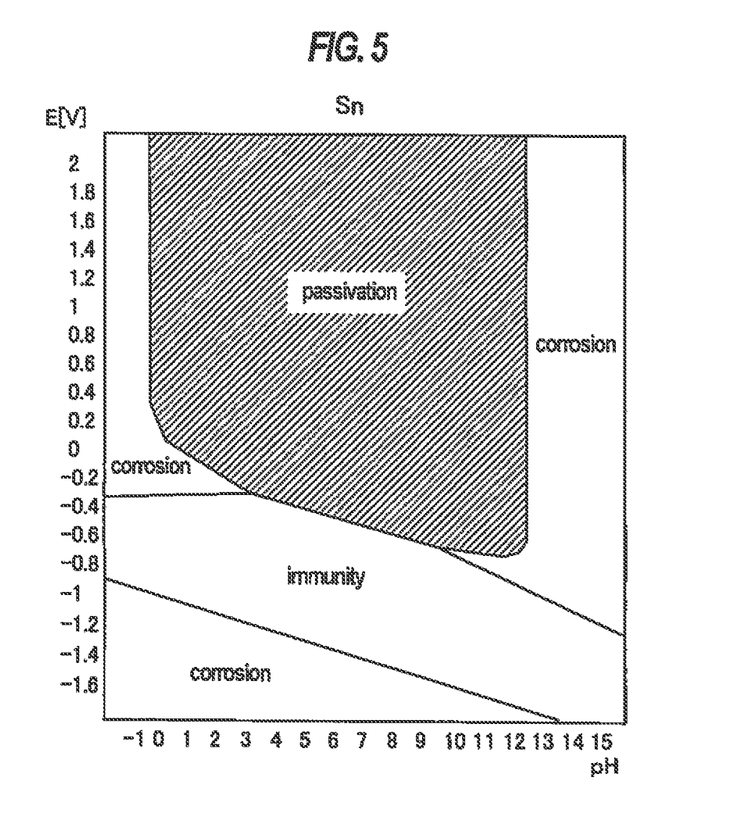
FIG. 5 is a Pourbaix diagram of tin.
Figure 6:
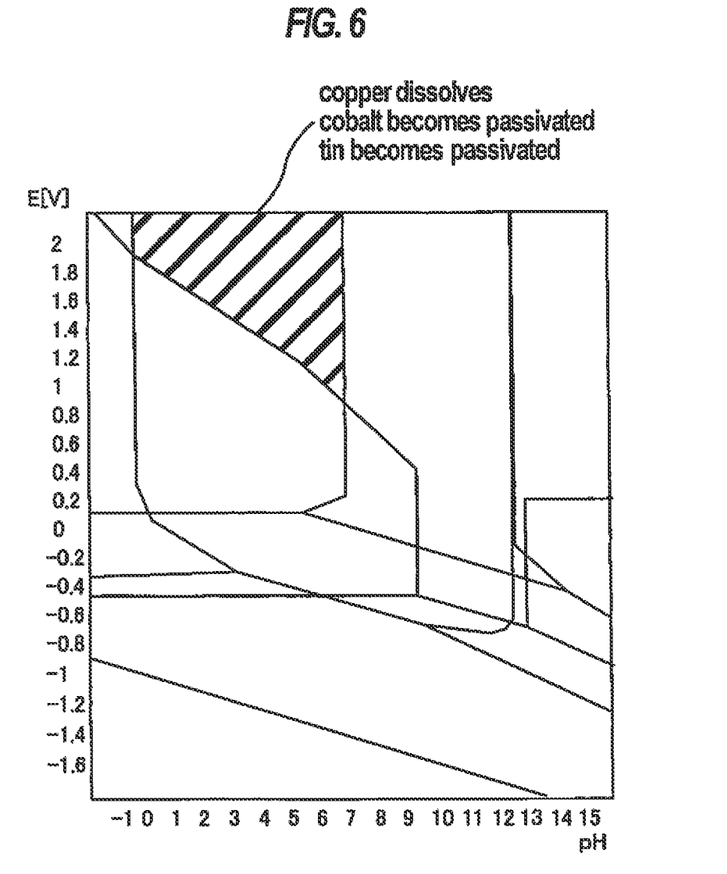
FIG. 6 is a Pourbaix diagram obtained by overlapping the Pourbaix diagrams shown in FIG. 3 through FIG. 5.

FIG. 3 shows a Pourbaix diagram of copper, FIG. 4 shows a Pourbaix diagram of cobalt, and FIG. 5 shows a Pourbaix diagram of tin as a typical example of the solder layer. In FIG. 3 through FIG. 5, vertical axis represents surface potential, and horizontal axis represents pH. FIG. 6 shows a Pourbaix diagram obtained by overlapping the Pourbaix diagrams shown in FIG. 3 through FIG. 5. It can be seen by overlapping the Pourbaix diagrams shown in FIG. 3 through FIG. 5 that, in a region where pH is in a range of 0 to 7 and an electric potential is high, the copper dissolves while cobalt and tin become passivated and therefore do not dissolve. Based on this finding, a verification experiment was conducted for verifying the etching liquid that can etch only the copper layer 4 without dissolving the cobalt layer 6 and the solder layer 7. The verification experiment will be explained below.

In this verification experiment, citric acid was used, instead of sulfuric acid which is a strong acid, in order to place pH of the etching liquid in a range of 1.6 to 8.0 and to make the surface potential high. The multilayer structure shown in FIG. 1 was brought into contact with the etching liquid under conditions of various pH and various concentrations of the hydrogen peroxide.

Figure 7:
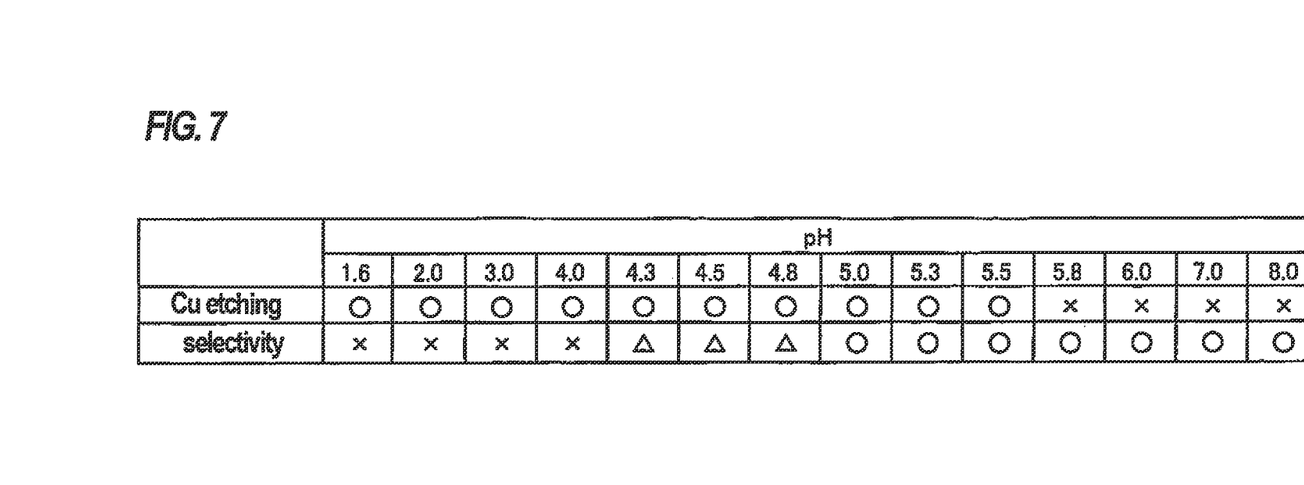
FIG. 7 is a table showing results of a verification experiment for an etching liquid according to an embodiment.

Results of this verification experiment are shown in FIG. 7. The etching liquid used in the experiment contained citric acid, 30% hydrogen peroxide solution, and pure water. This 30% hydrogen peroxide solution means that 100 ml of the hydrogen peroxide solution contains 30 g of hydrogen peroxide dissolved therein. A concentration of the citric acid in the etching liquid was 50 g/L. Furthermore, an aqueous sodium hydroxide, serving as a pH adjuster, was added to this etching liquid. An item "Cu etching" in FIG. 7 indicates an etched state of the copper seed layer 4. A symbol "○" in this item indicates that there was no residue of the copper seed layer 4, and a symbol "×" indicates that there existed residues of the copper seed layer 4. An item "selectivity" in FIG. 7 indicates an etched state of the cobalt layer 6 composed of cobalt. A symbol "○" in this item indicates that the cobalt layer 6 was not etched, a symbol "Δ" indicates that the cobalt layer 6 was slightly etched (with no problem in practical use), and a symbol "×" indicates that the cobalt layer 6 was greatly etched.

As shown in FIG. 7, when pH of the etching liquid was equal to or lower than 4.0, the etching of the cobalt layer 6 remarkably progressed. On the other hand, when pH of the etching liquid was equal to or more than 5.8, the etching of the copper seed layer 4 did not progress, and the copper seed layer 4 was not completely removed even after an etching time exceeded 10 minutes. It can be seen from these experimental results that a preferable range of pH of the etching liquid is 4.3 to 5.5. More preferably, pH is in a range of 5.0 to 5.5, in which the copper seed layer 4 is completely removed and the cobalt layer 6 is not etched. It was found out from the experimental results that a good selectivity can be obtained when the concentration of the hydrogen peroxide in the etching liquid is equal to or more than 0.7% by weight (30% hydrogen peroxide solution is equal to or more than 20 mL/L), more preferably equal to or more than 1.5% by weight (30% hydrogen peroxide solution is equal to or more than 50 mL/L). However, if the concentration of the hydrogen peroxide in the etching liquid is too high, spontaneous decomposition of the etching liquid progresses. Therefore, the concentration of the hydrogen peroxide is preferably equal to or lower than 10% by weight (30% hydrogen peroxide solution is equal to or lower than 300 mL/L), more preferably equal to or lower than 7% by weight (30% hydrogen peroxide solution is equal to or lower than 200 mL/L).

When oxalic acid, malic acid, or malonic acid is used instead of citric acid, the same advantageous effects can be obtained. The etching liquid may be prepared by using a combination of at least two of citric acid, oxalic acid, malic acid, and malonic acid. In other words, at least one acid selected from a group consisting of citric acid, oxalic acid, malic acid, and malonic acid is used in the etching liquid according to the embodiment.

As described above, the etching liquid according to the embodiment uses at least one acid selected from a group consisting of citric acid, oxalic acid, malic acid, and malonic acid, instead of sulfuric acid which is a strong acid, in order to place pH of the etching liquid in the range of 4.3 to 5.5. The reason for this is that use of any one of these acids can make it easier to adjust pH within a weakly acidic range. In particular, when citric acid is used, citrate ions coordinate with copper that is dissolved in the etching liquid to thereby stabilize the etching liquid. Therefore, even if a concentration of copper ions in the etching liquid increases, a decrease in an etching rate can be prevented.

When citric acid is used in the etching liquid, a concentration of citrate ions in the etching liquid is equal to or more than 0.2 mol/L, preferably equal to or more than 0.4 mol/L. A low concentration of citrate ions is likely to cause the spontaneous decomposition of the etching liquid when copper ions are accumulated in the etching liquid. An upper limit of the concentration of citrate ions in the etching liquid is a saturated solubility of citric acid in the etching liquid.

The concentration of the hydrogen peroxide in the etching liquid is 0.7% to 10% by weight (20 to 300 mL/L of 30% hydrogen peroxide solution), preferably 1.5% to 7% by weight (50 to 200 mL/L of 30% hydrogen peroxide solution). If the concentration of the hydrogen peroxide is low, a surface roughness of copper increases. On the other hand, if the concentration of the hydrogen peroxide is high, the etching liquid is likely to be decomposed spontaneously.

When the hydrogen peroxide is brought into contact with the copper seed layer 4, copper oxide is formed on a surface of the copper seed layer 4. This copper oxide is dissolved by at least one acid selected from a group consisting of citric acid, oxalic acid, malic acid, and malonic acid. Such formation and dissolution of the copper oxide occur repeatedly, and as a result the etching of the copper seed layer 4 progresses. As described above, it is preferable to maintain a high surface potential of the copper seed layer 4 during etching because copper is likely to be oxidized when the surface potential is high. Therefore, it is preferred that the concentration of the hydrogen peroxide be high. However, if the concentration of the hydrogen peroxide is too high, the etching liquid is likely to be decomposed spontaneously. Therefore, as a condition of using the etching liquid, an upper limit of the concentration of the hydrogen peroxide is preferably 10% by weight.

In order to adjust pH of the etching liquid within a range of 4.3 to 5.5, the pH adjuster is used. The pH adjuster includes at least one of an aqueous sodium hydroxide, an aqueous solution of potassium hydroxide, an aqueous solution of ammonia, and an alkaline ionized water. The alkaline ionized water can be produced by electrolysis of pure water. Citric acid may be combined with at least one compound selected from a group consisting of sodium citrate, potassium citrate, and ammonium citrate as the pH adjuster. In a case of using sodium citrate, potassium citrate, or ammonium citrate, a change in pH is slower than in a case of using the aqueous sodium hydroxide. Therefore, it is easy to adjust pH of the etching liquid.

An example of experiment in which the etching liquid according to the embodiment is used, and comparative examples in which a conventional etching liquid is used, will be explained below.

COMPARATIVE EXAMPLE 1

A specimen prepared for an experiment had the same multilayer structure as one shown in FIG. 1, and was fabricated as follows. A resist (not shown), having an opening with a diameter of 100 μm, was formed on the copper seed layer 4 having a thickness of 250 nm. The copper bump layer 5 having a thickness of 20 μm was formed in the opening by electroplating. The cobalt layer 6 having a thickness of 5 μm, as a cobalt barrier layer, was formed on the copper bump layer 5 by electroplating. Further, the solder layer 7 having a thickness of 10 μm and composed of an alloy of tin and copper (Sn—Cu alloy) is formed on the cobalt layer 6 by electroplating. The resist was removed by a resist-removing solution after the copper bump layer 5, the cobalt layer 6, and the solder layer 7 were formed.

Figure 8:
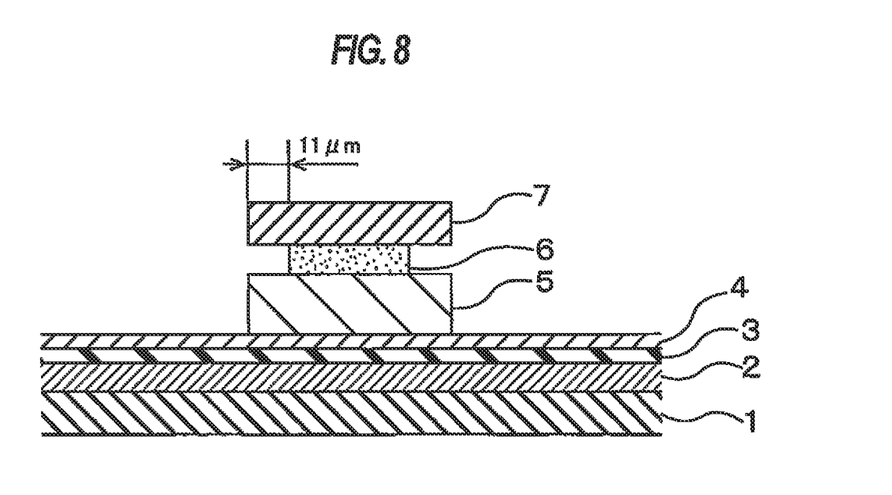
FIG. 8 is a schematic view showing a cross section of a specimen etched by an etching liquid used in a comparative example 1.

This specimen was immersed for 120 seconds in an etching liquid including sulfuric acid having a concentration of 31.6% by weight and hydrogen peroxide having a concentration of 1.5% by weight. A pH of this etching liquid was less than 1. The specimen was cleaned and dried, and then a cross-section of the etched specimen was observed. This cross-section is schematically shown in FIG. 8. As shown in FIG. 8, the cobalt layer 6 in the comparative example 1 was dissolved in the etching liquid, while the copper seed layer 4 was not etched. The cobalt layer 6 retreated by 11 μm from an outer edge of the copper bump layer 5.

COMPARATIVE EXAMPLE 2

Figure 9:
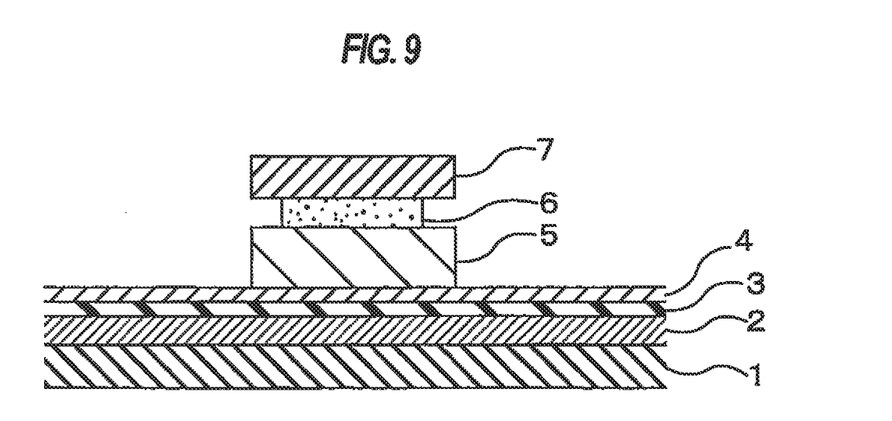
FIG. 9 is a schematic view showing a cross section of a specimen etched by an etching liquid used in a comparative example 2.

The same specimen as one described above was prepared, and the specimen was immersed for 600 seconds in an etching liquid including citric acid monohydrate having a concentration of 50 g/L and hydrogen peroxide having a concentration of 1.5% by weight. A pH of this etching liquid was 1.6. The specimen was cleaned and dried, and then a cross-section of the etched specimen was observed. This cross-section is schematically shown in FIG. 9. As shown in FIG. 9, the cobalt layer 6 in the comparative example 2 was dissolved in the etching liquid, and the copper seed layer 4 was not etched. It can be seen from this experimental result that the etching liquid containing merely citric acid and hydrogen peroxide etches the cobalt layer 6.

EXAMPLE

Etching Liquid According to an Embodiment

Figure 10:
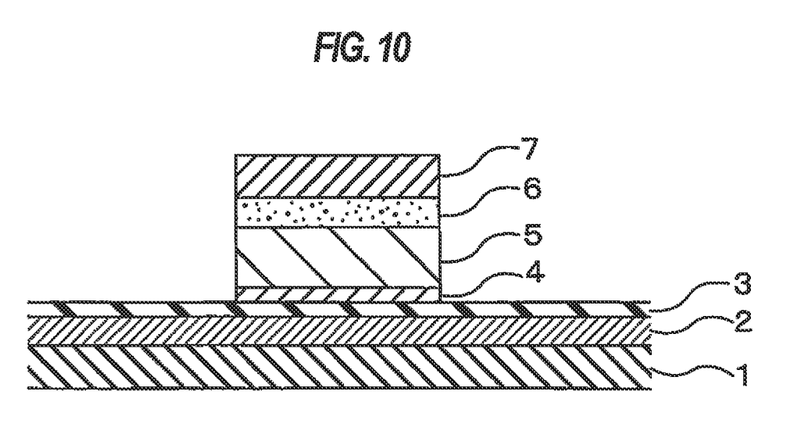
FIG. 10 is a schematic view showing a cross section of a specimen etched by an etching liquid according to an embodiment.

The same specimen as one described above was prepared, and the specimen was immersed for 600 seconds in an etching liquid including citric acid monohydrate having a concentration of 20.4 g/L, trisodium citrate dihydrate having a concentration of 41.1 g/L, and hydrogen peroxide having a concentration of 1.5% by weight. A pH of this etching liquid was 5.3. A concentration of citrate ions in this etching liquid was equivalent to a concentration of citrate ions in the comparative example 2. The specimen was cleaned and dried, and then a cross-section of the etched specimen was observed. This cross-section is schematically shown in FIG. 10. As shown in FIG. 10, the cobalt layer 6 and the solder layer 7 were dissolved in the etching liquid, while the copper seed layer 4 was etched and removed. It can be seen from this experimental result that only the copper seed layer 4 can be etched away without dissolving the cobalt layer 6 by using the etching liquid including citric acid and hydrogen peroxide and having pH adjusted in a predetermined range (i.e., 4.3 to 5.5).

Figure 11:
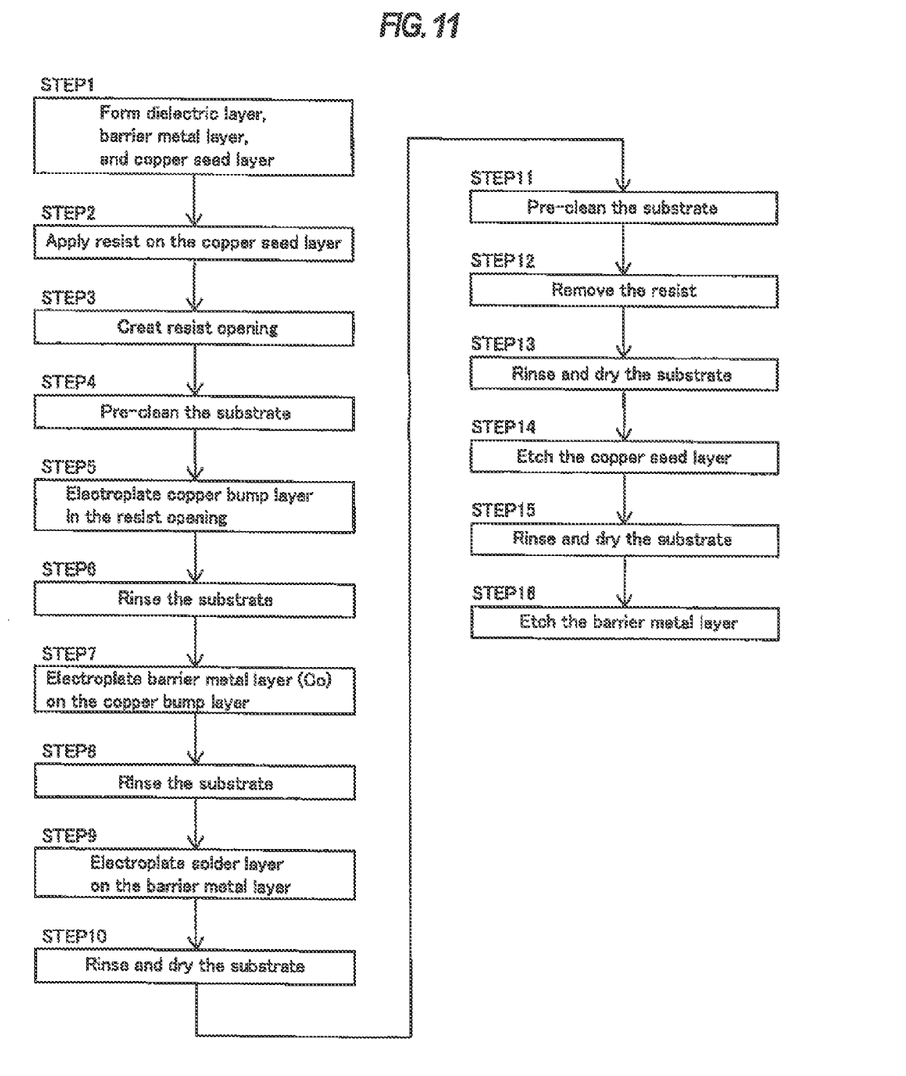
FIG. 11 is a flow chart of a method of manufacturing a solder bump.
Figure 12A:
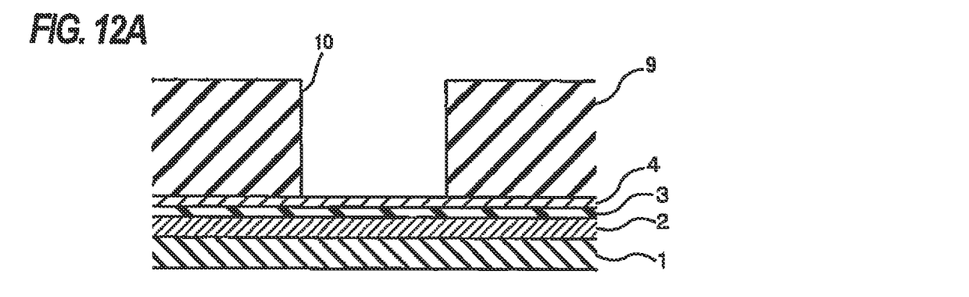
FIG. 12A, FIG. 12B, FIG. 12C, and FIG. 12D are schematic cross-sectional views each showing a multilayer structure in a former part of the flow chart shown in FIG. 11.
Figure 12B:
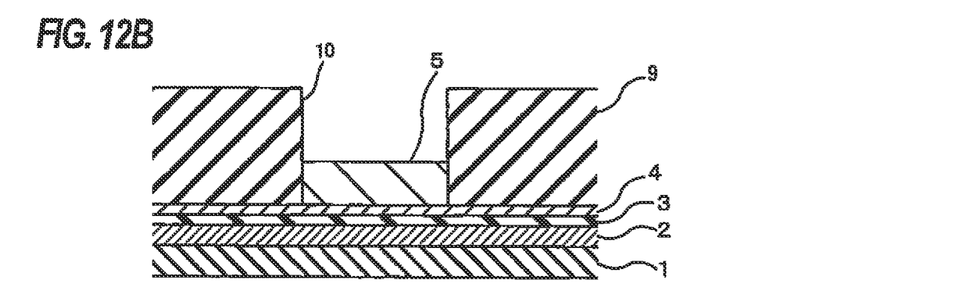
Figure 12C:
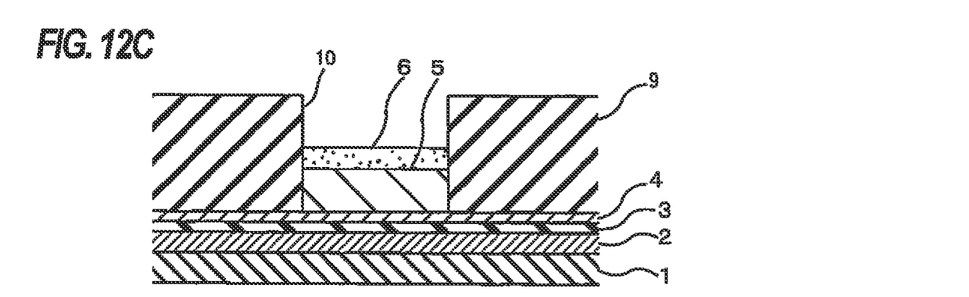
Figure 12D:
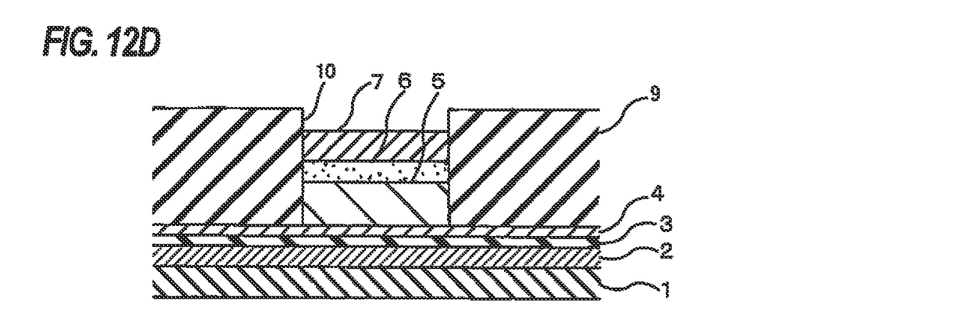
Figure 13A:
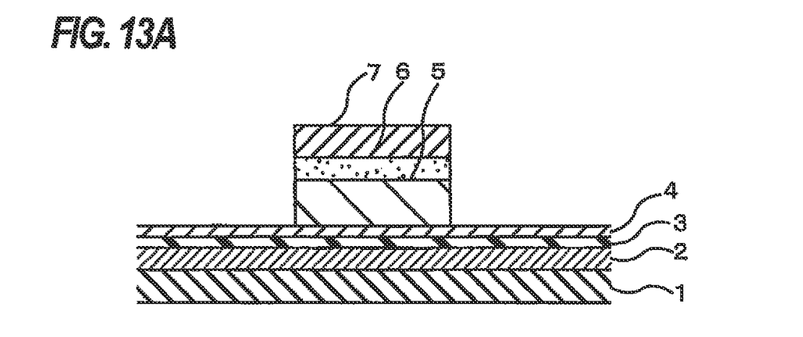
FIG. 13A, FIG. 13B, and FIG. 13C are schematic cross-sectional views each showing the multilayer structure in a latter part of the flow chart shown in FIG. 11.
Figure 13B:
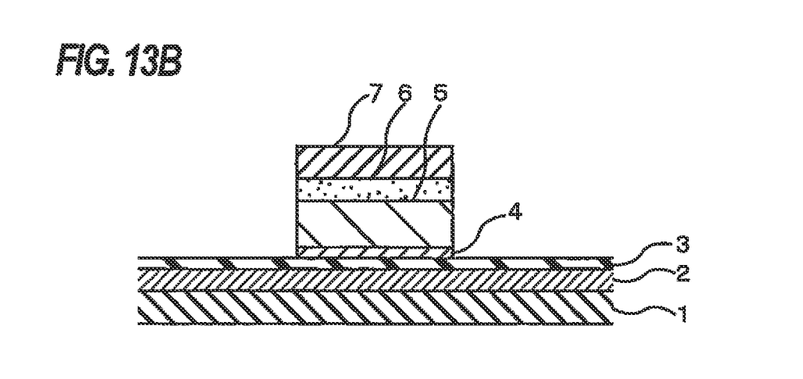
Figure 13C:
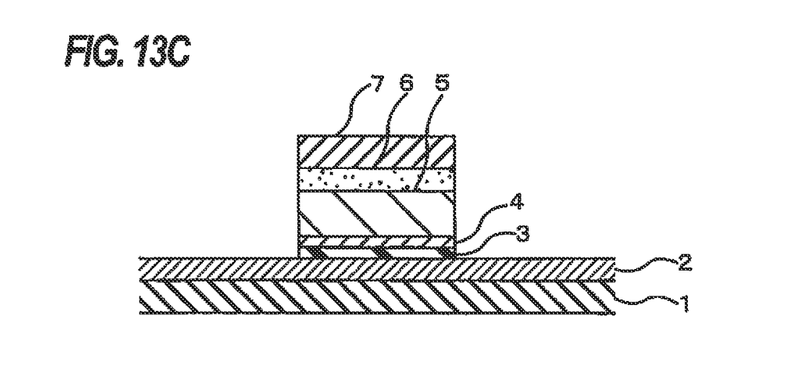

Next, a method of manufacturing a solder bump with use of an etching method in which the etching liquid according to the embodiment is used will be explained with reference to FIG. 11 through FIG. 13. FIG. 11 is a flow chart of a method of manufacturing a solder bump, FIG. 12A through FIG. 12D are schematic cross-sectional views each showing a multilayer structure in a former part of the flow chart shown in FIG. 11, and FIG. 13A through FIG. 13C are schematic cross-sectional views each showing a multilayer structure in a latter part of the flow chart shown in FIG. 11.

First, a dielectric layer 2 is formed on a silicon substrate 1, a barrier metal layer 3 is formed on the dielectric layer 2, and a copper seed layer 4 is formed on the barrier metal layer 3 by a sputtering method (step 1). A resist 9 is then applied onto the copper seed layer 4 (step 2). The resist 9 is exposed to light and developed, so that a resist opening 10 is created at a predetermined position in the resist 9 (step 3; see FIG. 12A).

Next, this substrate is preliminary cleaned (pre-cleaning) (step 4). Electroplating is then performed to form a copper bump layer 5 in the resist opening of the pre-cleaned substrate (step 5; see FIG. 12B). Then, this substrate is rinsed (step 6). After rinsing, a cobalt layer 6 which is a cobalt barrier layer is formed on the copper bump layer 5 by electroplating (step 7; see FIG. 12C). Then, this substrate is rinsed (step 8). After rinsing, a solder layer 7 is formed on the cobalt layer 6 by electroplating (step 9; see FIG. 12D). This solder layer 7 may be a layer of an alloy of tin and copper (Sn—Cu alloy layer). After the solder layer 7 is formed, the substrate is rinsed and dried (step 10).

The rinsed and dried substrate is preliminary cleaned (pre-cleaning) (step 11). The pre-cleaned substrate is immersed in an alkaline resist-removing solution, so that the resist 9 is removed (step 12; see FIG. 13A). After the resist 9 is removed, the substrate is rinsed and dried (step 13). If the substrate is permitted to be in a wet state during transporting of the substrate, the drying process in the step 13 may be omitted in order to prevent a surface of the substrate from being oxidized.

Next, this substrate is immersed in the above-described etching liquid. An exposed portion of the copper seed layer 4 is etched away by the contact with the etching liquid (step 14; see FIG. 13B). Next, this substrate is rinsed and dried (step 15). Further, an exposed portion of the barrier metal layer 3 is etched away (step 16; see FIG. 13C). In this etching of the barrier metal layer 3, a dry etching technique (e.g., plasma etching) or a wet etching technique using an etching liquid is appropriately selected depending on a metal forming the barrier metal layer 3. In particular, if titanium (Ti) is used for the barrier metal layer 3, the wet etching technique, whose apparatus is relatively simple and low-cost, can be selected.

Although the embodiments have been described above, it should be understood that the present invention is not limited to the above embodiments, and various changes and modifications may be made without departing from the scope of the appended claims.

What is claimed is:

1. An etching method, comprising:
   preparing a substrate on which a multilayer structure including a copper layer and a cobalt layer is formed by
      applying a resist onto a copper seed layer formed on the substrate,
      creating an opening in the resist,
      forming a copper bump layer and the cobalt layer in the opening, and
      removing the resist;
   preparing an etching liquid including hydrogen peroxide and at least one acid selected from a group consisting of citric acid, oxalic acid, malic acid, and malonic acid, the etching liquid having pH in a range of 4.3 to 5.5; and
   bringing an exposed portion of the copper seed layer into contact with the etching liquid to thereby etch the exposed portion of the copper seed layer.

2. The etching method according to claim 1, wherein the etching liquid further includes a pH adjuster including at least one of an aqueous sodium hydroxide, an aqueous solution of potassium hydroxide, an aqueous solution of ammonia, and an alkaline ionized water.

3. The etching method according to claim 1, wherein the at least one acid is citric acid, and a concentration of citrate ions in the etching liquid is equal to or more than 0.2 mol/L.

4. The etching method according to claim 1, wherein a concentration of the hydrogen peroxide is in a range of 0.7% to 10% by weight.

5. A method of manufacturing a solder bump, comprising:
   applying a resist onto a copper seed layer;
   creating an opening in the resist;
   forming a copper bump layer, a cobalt layer, and a solder layer in this order in the opening by electroplating;
   removing the resist; and
   bringing an exposed portion of the copper seed layer into contact with an etching liquid to thereby etch the exposed portion of the copper seed layer,
   the etching liquid including,
   (i) at least one acid selected from a group consisting of citric acid, oxalic acid, malic acid, and malonic acid; and
   (ii) hydrogen peroxide, the etching liquid having pH in a range of 4.3 to 5.5.

* * * * *